US011204663B2

(12) United States Patent
Lee et al.

(10) Patent No.: US 11,204,663 B2
(45) Date of Patent: Dec. 21, 2021

(54) DISPLAY PANEL HAVING A CONDUCTIVE MEMBER DISPOSED ON A SIDE SURFACE OF A DISPLAY LAYER AND ELECTRICALLY CONNECTED TO A TOUCH LAYER

(71) Applicant: Innolux Corporation, Miao-Li County (TW)

(72) Inventors: Kuan-Feng Lee, Miao-Li County (TW); Jui-Jen Yueh, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 17/070,936

(22) Filed: Oct. 15, 2020

(65) Prior Publication Data

US 2021/0132766 A1 May 6, 2021

(30) Foreign Application Priority Data

Oct. 30, 2019 (CN) .......................... 201911047835.1

(51) Int. Cl.
*G06F 3/041* (2006.01)
*H01L 27/15* (2006.01)
*H01L 27/32* (2006.01)
*G06F 3/14* (2006.01)

(52) U.S. Cl.
CPC ........ *G06F 3/04164* (2019.05); *G06F 3/0412* (2013.01); *H01L 27/156* (2013.01); *H01L 27/323* (2013.01); *H01L 27/3293* (2013.01); *G06F 3/1446* (2013.01); *G06F 2203/04102* (2013.01)

(58) Field of Classification Search
None
See application file for complete search history.

(56) References Cited

U.S. PATENT DOCUMENTS

| | | | | |
|---|---|---|---|---|
| 2018/0284935 A1* | 10/2018 | Lee | ....................... | G06F 1/1652 |
| 2019/0207167 A1* | 7/2019 | Lee | ..................... | H01L 27/3276 |
| 2019/0278411 A1* | 9/2019 | Jeon | ..................... | G02B 5/3025 |
| 2020/0161405 A1* | 5/2020 | Kim | .................... | H01L 27/3276 |

FOREIGN PATENT DOCUMENTS

| | | |
|---|---|---|
| EP | 3343274 | 7/2018 |
| EP | 3537257 | 9/2019 |

OTHER PUBLICATIONS

"Search Report of Europe Counterpart Application", dated Mar. 15, 2021, p. 1-p. 10.

* cited by examiner

*Primary Examiner* — Kirk W Hermann
(74) *Attorney, Agent, or Firm* — JCIPRNET

(57) ABSTRACT

A display panel, including a substrate, a plurality of light-emitting units, a touch layer, and a conductive member, is provided. The substrate has a top surface, a bottom surface, and a first side surface disposed therebetween. The plurality of light-emitting units are disposed on the top surface. The touch layer is disposed on the top surface. The conductive member is disposed on the first side surface and electrically connected to the touch layer.

3 Claims, 8 Drawing Sheets

DISPLAY PANEL HAVING A CONDUCTIVE MEMBER DISPOSED ON A SIDE SURFACE OF A DISPLAY LAYER AND ELECTRICALLY CONNECTED TO A TOUCH LAYER

CROSS-REFERENCE TO RELATED APPLICATION

This application claims the priority benefit of Chinese patent application serial no. 201911047835.1, filed on Oct. 30, 2019. The entirety of the above-mentioned patent application is hereby incorporated by reference herein and made a part of this specification.

BACKGROUND OF THE INVENTION

1. Field of the Invention

The disclosure relates to a display panel, in particular to a display panel with a touch function.

2. Description of Related Art

Electronic products have become indispensable necessities in modern society. With the rapid development of such electronic products, consumers have very high expectations for the quality, function or price of these products. Therefore, the electronic products need to be improved, such as introduction of the touch function, but there are still some problems needing to be solved.

SUMMARY OF THE INVENTION

The disclosure provides a display panel capable of providing a touch function.

According to an embodiment of the disclosure, a display panel includes a substrate, a plurality of light-emitting units, a touch layer and a conductive member. The substrate has a top surface, a bottom surface and a first side surface disposed therebetween. The plurality of light-emitting units are disposed on the top surface. The touch layer is disposed on the top surface. The conductive member is disposed on the first side surface and electrically connected to the touch layer.

According to another embodiment of the disclosure, a display panel includes a substrate, a plurality of light-emitting units, a touch layer, a conductive member and a driving circuit. The substrate has a top surface, a bottom surface and a first side surface disposed therebetween. The plurality of light-emitting units are disposed on the top surface. The touch layer is disposed on the top surface. The driving circuit is electrically connected to the touch layer through the conductive member.

Based on the above, in the embodiments of the disclosure, a touch signal (such as a drive signal or a sensing signal) is transmitted through the conductive member electrically connected to the touch layer, and therefore, the display panel can provide the touch function.

To make the features and advantages of the disclosure clear and easy to understand, the following gives a detailed description of embodiments with reference to accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
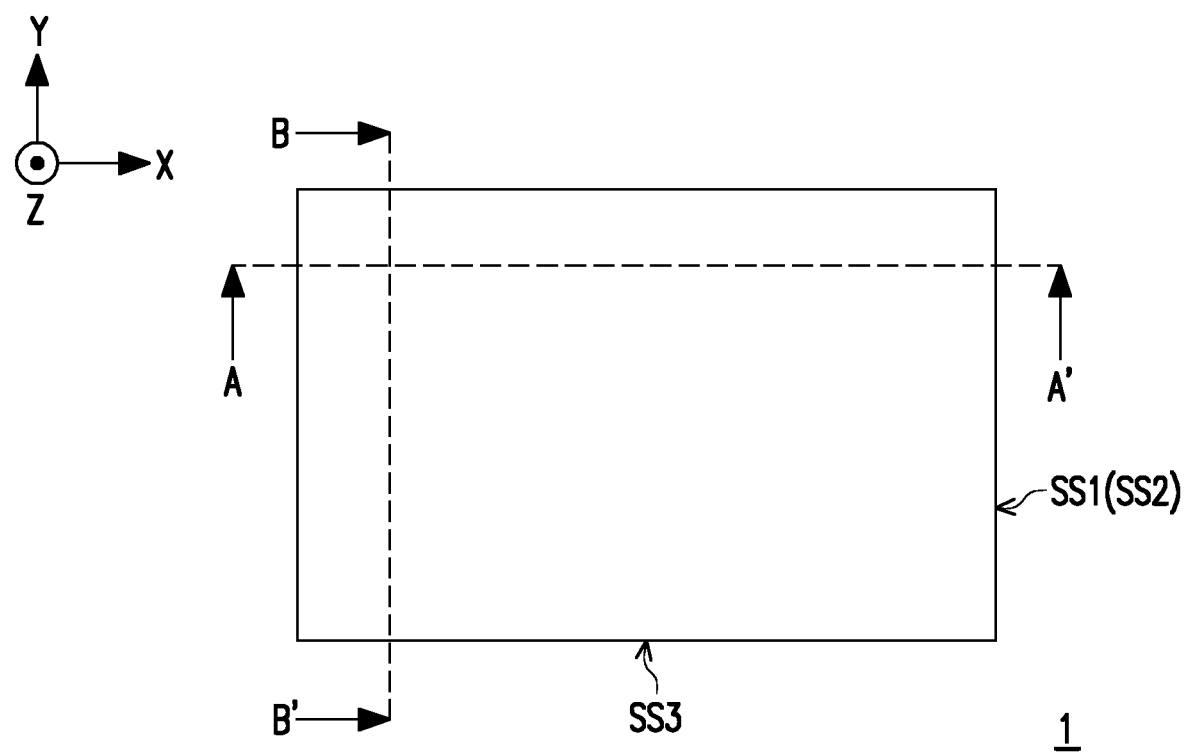
FIG. 1 is a schematic top view of a display panel in some embodiments of the disclosure.

The disclosure may be understood with reference to the following detailed description and the accompanying drawings. It should be noted that, for ease of understanding by readers and concise drawings, a plurality of accompanying drawings in the disclosure merely show a part of an electronic device or a display device, and specific elements in the accompanying drawings are not drawn to scale. In addition, the quantity and size of the elements in the drawings are merely exemplary, and are not intended to limit the scope of the disclosure. For example, relative sizes, thicknesses, and positions of films, regions, and/or structures may be reduced or enlarged for clarity.

Some words are used to refer to specific elements in the whole specification and the appended claims in the disclosure. A person skilled in the art should understand that an electronic device manufacturer may use different names to refer to the same elements. This specification is not intended to distinguish elements that have the same functions but different names. In this specification and the claims, words such as "have" and "include/comprise" are open words, and should be interpreted as "including, but not limited to".

The directional terms mentioned herein, such as "above", "below", "front", "back", "left", and "right" refer to the directions in the accompanying drawings. Therefore, the directional terms are only used for illustration instead of limiting the disclosure. It should be understood that, when an element or a film is referred to as being "on" another element or film or "connected to" another element or film, the element or film may be directly on the another element or film or directly connected to the another element or film, or there are elements or films inserted between the two elements or films (indirectly). On the contrary, when an element or a film is referred to as being "directly" "on" another element or film or "directly connected to" another element or film, there is no element or film inserted between the two elements or films.

The term "approximately", "equal to", "the same as", "substantially" or "roughly" referred to herein generally represents falling within 10% of a given value or a range, or represents falling within 5%, 3%, 2%, 1%, or 0.5% of a given value or a range. In addition, phrases "a given range is a first value to a second value" and "a given range falls within a range of a first value to a second value" mean that the given range includes the first value, the second value, and other values between the first value and the second value.

In some embodiments of the disclosure, terms such as "connect" and "interconnect" with regard to bonding and connection, unless specifically defined, may mean that two structures are in direct contact, or may mean that two structures are not in direct contact, and there is another structure between the two structures. The terms with regard to bonding and connection may also include a case where both structures are movable or both structures are fixed. In addition, the terms "electrical connection" and "coupling" include any direct and indirect means of electrical connection.

In the following embodiments, same or similar reference numerals are used to indicate same or similar elements, and details may be omitted in the description. In addition, the features in the embodiments may be used in any combination without departing from the spirit of the invention or conflicting with each other, and simple equivalent changes and modifications made to the specification or the claims shall still fall within the scope of the disclosure. Besides, the terms "first", "second" and the like mentioned in the specification or the claims are used only to name discrete elements or to distinguish different embodiments or ranges, but are not intended to define the upper or lower limit of the number of elements or the manufacturing or arrangement order of the elements.

A display panel of the disclosure may be applied to any kind of electronic devices. The electronic devices may include display devices, antenna devices, sensing devices, light-emitting devices or tiling devices, but are not limited to this. The electronic devices may include bendable or flexible electronic devices, but are not limited to this.

The display panel of the disclosure may include any kind of display panels, such as a self-light-emitting display panel. The self-light-emitting display panel may include a light-emitting unit, a light conversion layer or other suitable materials or a combination of the above, but is not limited to this. The light-emitting unit may include, for example, a light emitting diode (LED), an organic light emitting diode (OLED), a mini light emitting diode (mini LED), a micro light emitting diode (micro LED) or a quantum dot light emitting diode (quantum dot LED) (which may include QLED and QDLED), but is not limited to this. The light conversion layer may include a wavelength conversion material and/or a light filter material. The light conversion layer may include, for example, fluorescence, phosphor, quantum dots (QDs), other suitable materials or a combination of the above, but is not limited to this. The content of the disclosure will be described with an LED display panel below, but the disclosure is not limited to this.

Figure 2A:
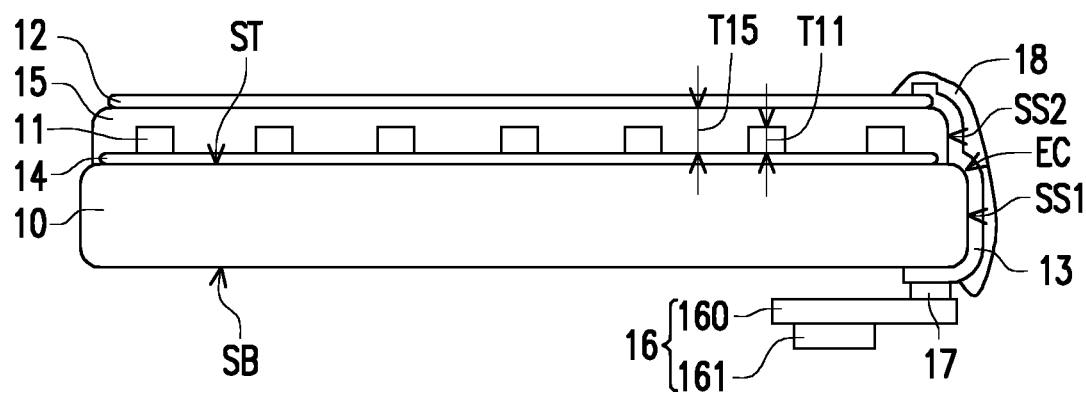
FIG. 2A and FIG. 2B are schematic cross-sectional diagrams corresponding to a section line A-A' and a section line B-B' in FIG. 1 respectively.
Figure 2B:
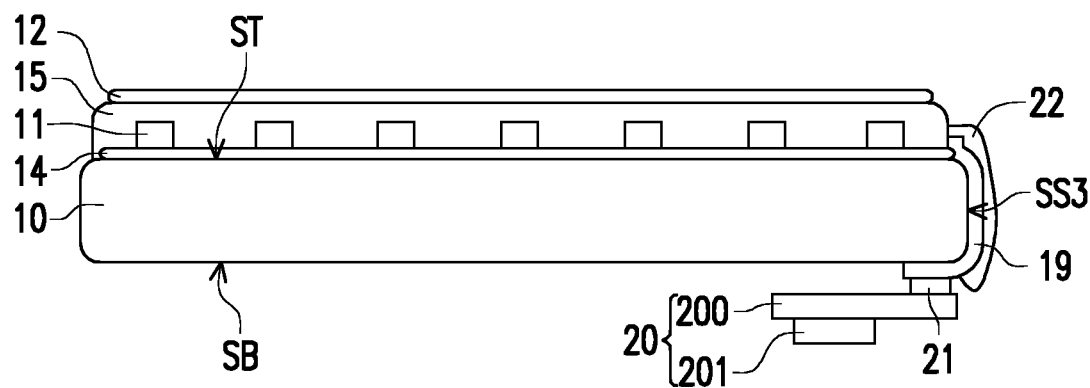

FIG. 1 is a schematic top view of a display panel 1 in some embodiments of the disclosure. FIG. 2A and FIG. 2B are schematic cross-sectional diagrams corresponding to a section line A-A' and a section line B-B' in FIG. 1 respectively. Referring to FIG. 1 to FIG. 2B, the display panel 1 may include a substrate 10, a plurality of light-emitting units 11, a touch layer 12 and a conductive member 13.

The substrate 10 may be configured to carry elements. The substrate 10 may include a transparent substrate or an opaque substrate. The transparent substrate may include a glass substrate, a plastic substrate, a resin substrate or a combination of the above, but is not limited to this. The opaque substrate may include a metal substrate, an alloy substrate, a circuit board or a combination of the above, but is not limited to this. The substrate may include a single-layer substrate or a composite substrate. The substrate 10 may be bendable, flexible or rigid. The substrate 10 may be curved, planar, or a combination of the above. An edge corner EC of the substrate 10 may be a right angle, a C-type guide angle or an R-angle.

The substrate 10 has a top surface ST, a bottom surface SB and a first side surface SS1 disposed therebetween, in other words, the first side surface SS1 located between the top surface ST and the bottom surface SB. The top surface ST and the bottom surface SB are opposite to each other. The first side surface SS1 connects the top surface ST and the bottom surface SB.

The plurality of light-emitting units 11 are disposed on the top surface ST. The plurality of light-emitting units 11 may be configured to provide light beams. The plurality of light-emitting units 11 may include a plurality of self-light-emitting units. The plurality of self-light-emitting units include, for example, a light emitting diode (LED), an organic light emitting diode (OLED), a mini light emitting diode (mini LED), a micro light emitting diode (micro LED) or a quantum dot light emitting diode (quantum dot LED) (which may include QLED and QDLED), but are not limited to this.

The touch layer 12 is disposed on the top surface ST. As shown in FIG. 2A and FIG. 2B, the plurality of light-emitting units 11 may be located between the touch layer 12 and the substrate 10, but is not limited to this. The touch layer 12 may be used for touch detection. The touch layer 12 may be a patterned conductive layer and may include a plurality of sensing electrodes (not shown) and a plurality of signal lines (not shown) electrically connected to the plurality of sensing electrodes, but is not limited to this.

The touch layer 12 may allow the light beams emitted by the plurality of light-emitting units 11 to penetrate. For example, materials of the touch layer 12 may include metal oxides, metal grids, conductive polymers, nano silver wires, nano carbon tubes, graphene or a combination of the above, but are not limited to this. The metal oxides may be indium tin oxide (ITO), but are not limited to this. The metal grids may be composed of metal, alloy or a combination of the above, but are not limited to this. The touch layer 12 may be of a single-layer structure, and also may be of a multi-layer structure.

The conductive member 13 is disposed on the first side surface SS1 and electrically connected to the touch layer 12. As shown in FIG. 2A and FIG. 2B, the conductive member 13 may extend from the first side surface SS1 towards the touch layer 12 to be overlapped with at least a part of the touch layer 12 in a direction Z, and the conductive member 13 may be in contact with the touch layer 12 to achieve electrical connection, but is not limited to this. The direction Z is a normal direction (or a thickness direction) of the substrate 10.

Materials of the conductive member 13 may include, for example, conductive ink, conductive adhesives, conductive coatings or a combination of the above, but are not limited to this. In addition, the conductive member 13 is formed by, for example, printing the above materials on a film layer and/or an element and then performing high-temperature sintering, but is not limited to this. Printing may include screen printing, pad printing or ink-jet printing, but is not limited to this. Based on the consideration of the process, reliability or electrical property, a thickness of the conductive member 13 (such as a maximum thickness of the conductive member disposed on the first side surface SS1 in a direction X, and a maximum thickness of the conductive member 13 disposed on the top surface ST or the bottom surface SB in the direction Z) may be greater than a thickness of the touch layer 12 (such as a maximum thickness of the touch layer 12 in the direction Z). The direction X, a direction Y and the direction Z are perpendicular to each other.

According to different requirements, the display panel 1 may optionally include other elements or film layers. As shown in FIG. 2A and FIG. 2B, the display panel 1 may include a wiring layer 14. The wiring layer 14 may be disposed on the top surface ST and located between the plurality of light-emitting units 11 and the substrate 10. The wiring layer 14 is electrically connected to the plurality of light-emitting units 11 for signal transmission. The wiring layer 14 may be a patterned conductive layer and include a plurality of signal lines (not shown) electrically connected to the plurality of light-emitting units 11, but is not limited to this. Materials of the wiring layer 14 may include metal, alloy, other conductive materials or a combination of the above, but are not limited to this. The wiring layer 14 may be of a single-layer or multi-layer structure. The display panel 1 also may further include a plurality of active elements (not shown). The plurality of active elements may be a plurality of thin film transistors or a plurality of driving chips, but are not limited to this. The plurality of active elements are electrically connected to the plurality of signal lines electrically connected to the plurality of light-emitting units 11 so as to be controlled respectively.

The display panel 1 may include an insulating layer 15. The insulating layer 15 may be disposed between the substrate 10 and the touch layer 12. As shown in FIG. 2A and FIG. 2B, the insulating layer 15, for example, may be formed on the plurality of light-emitting units 11, the wiring layer 14 and the substrate 10. A maximum thickness T15 of the insulating layer 15 in the direction Z may be greater than a maximum thickness T11 of the light-emitting units 11 in the direction Z to provide a relatively flat surface for arranging the touch layer 12.

The insulating layer 15 may be configured to provide a protection (for example, anti-scraping) function for a covered element or film layer. In addition, through the selection of appropriate materials, the insulating layer 15 may provide an effect of reducing the invasion of water oxygen. Materials of the insulating layer 15 may include organic materials, inorganic materials or a combination of the above, but are not limited to this. The insulating layer 15 may be of a single-layer or multi-layer structure.

The insulating layer 15 has a second side surface SS2. As shown in FIG. 2A, the conductive member 13 may be disposed on the second side surface SS2. As shown in FIG. 2A, the conductive member 13 may extend from the first side surface SS1 to the second side surface SS2 and then be further connected to the touch layer 12. The second side surface SS2 may be located on the same side of the display panel 1 as the first side surface SS1 of the substrate 10, so as to shorten a signal transmission distance, reduce signal attenuation, decrease a wiring area or lower material cost, but is not limited to this. According to different design requirements, the second side surface SS2 and the first side surface SS1 may also be located on different sides of the display panel 1, but are not limited to this.

The display panel 1 may be provided with a driving circuit 16 for touch sensing. The driving circuit 16 may include a circuit board 160 and a driving chip 161, but is not limited to this. The circuit board 160 may be a flexible circuit board or a printed circuit board, but is not limited to this. The driving chip 161 is disposed on the circuit board 160 and electrically connected to the circuit board 160.

The driving circuit 16 may be electrically connected to the touch layer 12 through the conductive member 13. For example, the driving circuit 16 may be electrically connected to the conductive member 13 through a surface adhesion technology. The surface adhesion technology may include a ball grid array (BGA) technology, hot-melt welding or other technologies using conductors for press fitting, but is not limited to this. The conductors may include solder balls, solder paste, conductive adhesives or anisotropic conductive films (ACFs), but are not limited to this. In the present embodiment, as shown in FIG. 2A, the driving circuit 16, for example, is electrically connected to the conductive member 13 through a conductor 17. The driving chip 161 and the conductor 17 may be located on opposite sides of the circuit board 160 respectively, but are not limited to this. The conductive member 13 may extend from the first side surface SS1 to the bottom surface SB and be overlapped with at least a part of the bottom surface SB in the direction Z. The conductor 17 may be electrically connected to the conductive member 13 disposed on the bottom surface SB, and the driving circuit 16 may be disposed on the bottom surface SB. However, the arranging position of the driving circuit 16 is not limited to this. In some embodiments, the display panel 1 may omit the driving circuit 16 and the conductor 17.

The display panel 1 may further include a protective layer 18. The protective layer 18 is disposed on the conductive member 13 to provide a protection (for example, anti-scraping or water oxygen blocking) function for the conductive member 13. The protective layer 18 may be formed on the conductive member 13 by printing, but is not limited to this. For example, the protective layer 18 may overlap the conductive member 13 completely before removing a part of the protective layer 18 to arrange the conductor 17, or the protective layer 18 covering a part of the conductive member 13 may be directly formed. Materials of the protective layer 18 may include epoxy, silicone, acrylic-based resin, polyimide polymers or a combination of the above, but are not limited to this.

The protective layer 18 may be made of transparent, semi-transparent or light-shielding materials. If the protective layer 18 includes transparent materials, the influence of the protective layer 18 disposed on the top surface ST on the light beams emitted by the light-emitting units 11 may be lowered. On the other hand, if the protective layer 18 is made of the semi-transparent materials, the protective layer may be configured to shield the conductive member 13 or other lines, or reduce metallic luster reflection of metal lines to reduce the visibility of the metal lines. If the protective layer 18 includes light-shielding materials, the influence of the protective layer 18 on the light beams emitted by the light-emitting units 11 may be lowered through a design that the protective layer 18 disposed on the top surface ST is not overlapped with the light-emitting units 11 in the direction Z, but is not limited to this. In an embodiment, the protective layer 18 may be composed of a light-shielding layer (such as a reflective layer) and a semi-transparent layer (such as a light absorbing layer and an anti-reflective layer). That is to say, the protective layer 18 may be of a single-layer or multi-layer structure.

In an embodiment, based on the consideration of adhesion, protection or electrical property, the area of the conductor 17 covering the conductive member 13 may be increased, or one or more protective layers (not shown) may be additionally disposed. In an embodiment, the display panel 1 may utilize an external additional mechanism (not shown) to protect the conductive member 13 so as to omit the protective layer 18. In an embodiment, the display panel 1 may further include other fixing element (not shown) to fix the driving circuit 16.

As shown in FIG. 2B, the display panel 1 may further include a conductive member 19, a driving circuit 20, a conductor 21 and a protective layer 22. The conductive member 19 is disposed on a third side surface SS3 of the substrate 10 and electrically connected to the wiring layer 14. The third side surface SS3 connects the top surface ST and the bottom surface SB. The third side surface SS3 may be adjacent to the first side surface SS1, but is not limited to this. The conductive member 19 may extend from the third side surface SS3 towards the wiring layer 14 to be overlapped with at least a part of the wiring layer 14 in the direction Z, and the conductive member 19 may be electrically connected to the wiring layer 14, but is not limited to this.

The conductive member 19 may further extend from the third side surface SS3 to the bottom surface SB and be overlapped with at least a part of the bottom surface SB in the direction Z. The conductor 21 may be electrically connected to the conductive member 19 disposed on the bottom surface SB, and the driving circuit 20 may be disposed on the bottom surface SB. However, the arranging position of the driving circuit 20 is not limited to this. The driving circuit 20 may be electrically connected to the wiring layer 14 through the conductor 21 and the conductive member 19. The driving circuit 20 may include a circuit board 200 and a driving chip 201, but is not limited to this. The protective layer 22 is disposed on the conductive member 19 to provide a protection (for example, anti-scraping or water oxygen blocking) function for the conductive member 19. For detailed contents (such as manufacturing modes or materials) of the conductive member 19, the driving circuit 20, the conductor 21 and the protective layer 22, reference may be made to the relevant descriptions of the conductive member 13, the driving circuit 16, the conductor 17 and the protective layer 18 above, which will not be repeated here.

In some embodiments, the display panel 1 may omit the driving circuit 20 and the conductor 21. In an embodiment, based on the consideration of adhesion, protection or electrical property, the area of the conductor 21 covering the conductive member 19 may be increased, or one or more protective layers (not shown) may be additionally disposed. In an embodiment, the display panel 1 may utilize an external additional mechanism (not shown) to protect the conductive member 19 so as to omit the protective layer 22. In an embodiment, the display panel 1 may further include other fixing element (not shown) to fix the driving circuit 20.

According to different requirements, the touch layer 12 may be further provided with other elements or film layers. For example, the display panel 1 may further include a protective element (not shown). The protective element may be disposed on the touch layer 12 to protect the touch layer 12. The protective element may be transparent to allow the light beams emitted by the plurality of light-emitting units 11 to penetrate. The protective element may include a cover plate or a protective film. Materials of the cover plate may include glass, plastic, resin or a combination of the above, but are not limited to this. Materials of the protective film may include polyethylene terephthalate (PET) or acrylic, but are not limited to this. The display panel 1 may further include an adhesion layer or other fixing element (not shown), and the protective element can be fixed on the touch layer 12.

A thickness T11 of the light-emitting units 11 is in a range of 15 micro meters (μm) to 150 μm (15 μm≤thickness T11≤150 μm). A thickness T15 of the insulating layer 15 covering the light-emitting units 11 may be greater than the thickness T11 of the light-emitting units 11. In the present embodiment, by forming a wire (such as the conductive member 13) for electrically connecting the touch layer 12 and the driving circuit 16 on side surfaces of the insulating layer 15 and the substrate 10, the manufacturing difficulty of the wire may be lowered, or the yield of the display panel 1 may be improved. In some embodiments, by forming a wire (such as the conductive member 19) for electrically connecting the wiring layer 14 and the driving circuit 20 on side surfaces of the insulating layer 15 and the substrate 10, the manufacturing difficulty of the wire may be lowered, or the yield of the display panel 1 may be improved. In some embodiments, by arranging the driving circuit 16 and the driving circuit 20 on the bottom surface SB, it helps to achieve narrow frames.

In the present embodiment, the conductive member 13 and the conductive member 19 are located on two adjacent sides of the substrate 10, but are not limited to this. In other embodiments, the conductive member 13 and the conductive member 19 may be located on the same side, two opposite sides or a plurality of sides of the substrate 10.

Figure 3:
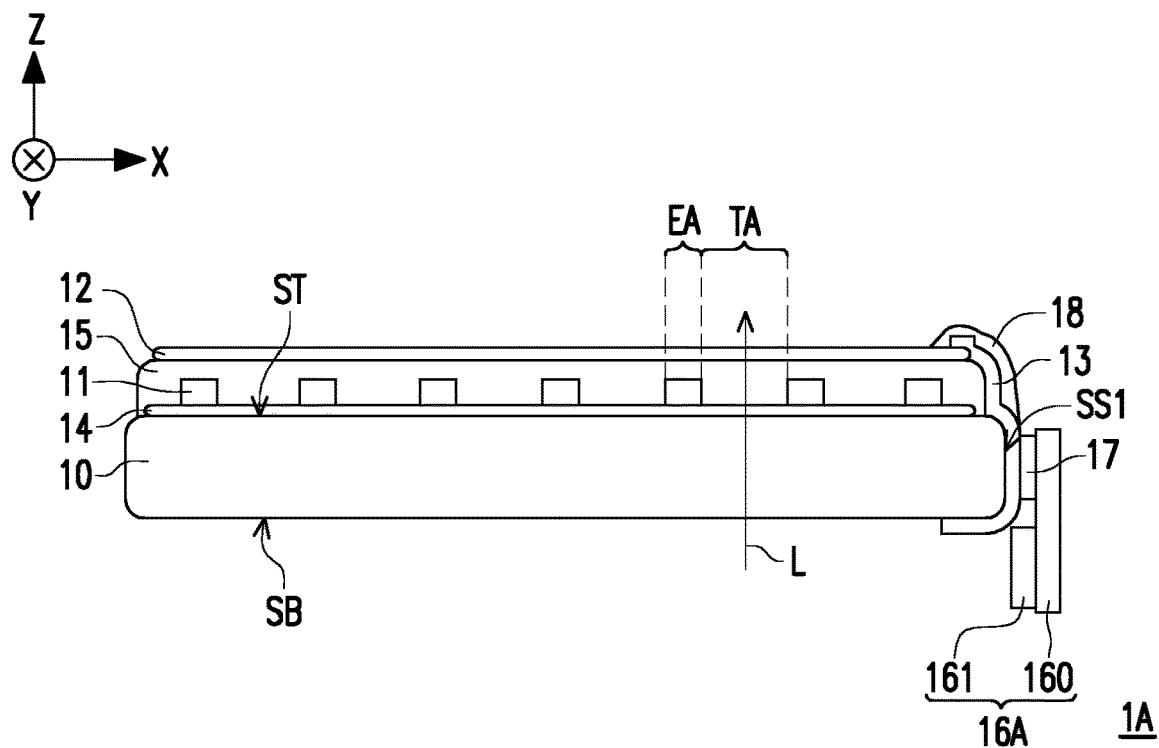
FIG. 3 is a schematic cross-sectional diagram of a display panel in some embodiments of the disclosure corresponding to the section line A-A' in FIG. 1.

FIG. 3 is a schematic cross-sectional diagram of a display panel 1A in some embodiments of the disclosure corresponding to the section line A-A' in FIG. 1. Referring to FIG. 3, in the display panel 1A, a driving circuit 16A is disposed on the first side surface SS1. In addition, the driving circuit 16A is electrically connected to the conductive member 13 through the conductor 17. In some embodiments, the driving chip 161 and the conductor 17 may be disposed on the same side of the circuit board 160. In some embodiments, the driving chip 161 and the conductor 17 may be disposed on different sides of the circuit board 160, but are not limited to this.

By arranging the driving circuit 16A on the first side surface SS1, shielding of a light beam from a position below the display panel 1A (such as a light beam L emitted to the display panel 1A from the bottom surface SB) by the driving circuit 16A may be reduced. Therefore, the display panel 1A may be either an opaque display panel or a transparent display panel. If it is the transparent display panel, a transparent substrate may be adopted as the substrate 10. The wiring layer 14 may be made of light-penetrating materials, such as metal oxides, metal grids, conductive polymers, nano silver wires, nano carbon tubes, graphene or a combination of the above, but is not limited to this. Alternatively, the wiring layer 14 may be made of light-shielding materials (such as metal or alloy), the light beam L emitted to the display panel 1A from the bottom surface SB may penetrate out of the wiring layer 14 from an area between light-shielding lines in the wiring layer 14 (namely an area without the light-shielding lines which is not shown). In the display panel 1A, an area EA where the light-emitting units 11 are located is a light-emitting area, and an area TA between two adjacent light-emitting units 11 is a light-penetrating area. The light-penetrating area may allow the light beam L emitted to the display panel 1A from the bottom surface SB to penetrate.

In some embodiments, based on the consideration of adhesion, protection or electrical property, the area of the conductor 17 covering the conductive member 13 may be increased, or one or more protective layers (not shown) may be additionally disposed. In an embodiment, the display panel 1A may utilize an external additional mechanism (not shown) to protect the conductive member 13 so as to omit the protective layer 18. In an embodiment, the display panel 1A may further include other fixing element (not shown) to fix the driving circuit 16A. In addition, the display panel 1A may further include a protective element (not shown). The protective element may be disposed on the touch layer 12 to protect the touch layer 12. The display panel 1A may further include an adhesion layer or other fixing element (not shown) to fix the protective element on the touch layer 12.

Figure 4:
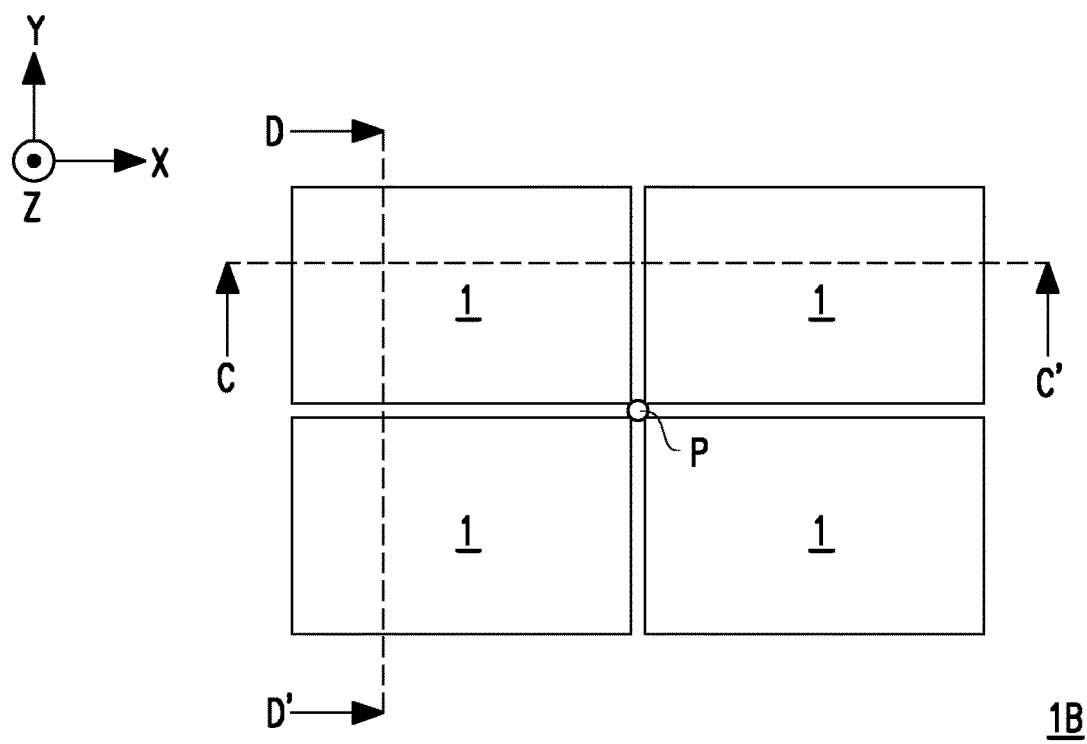
FIG. 4 is a schematic top view of a display panel in some embodiments of the disclosure.
Figure 5A:
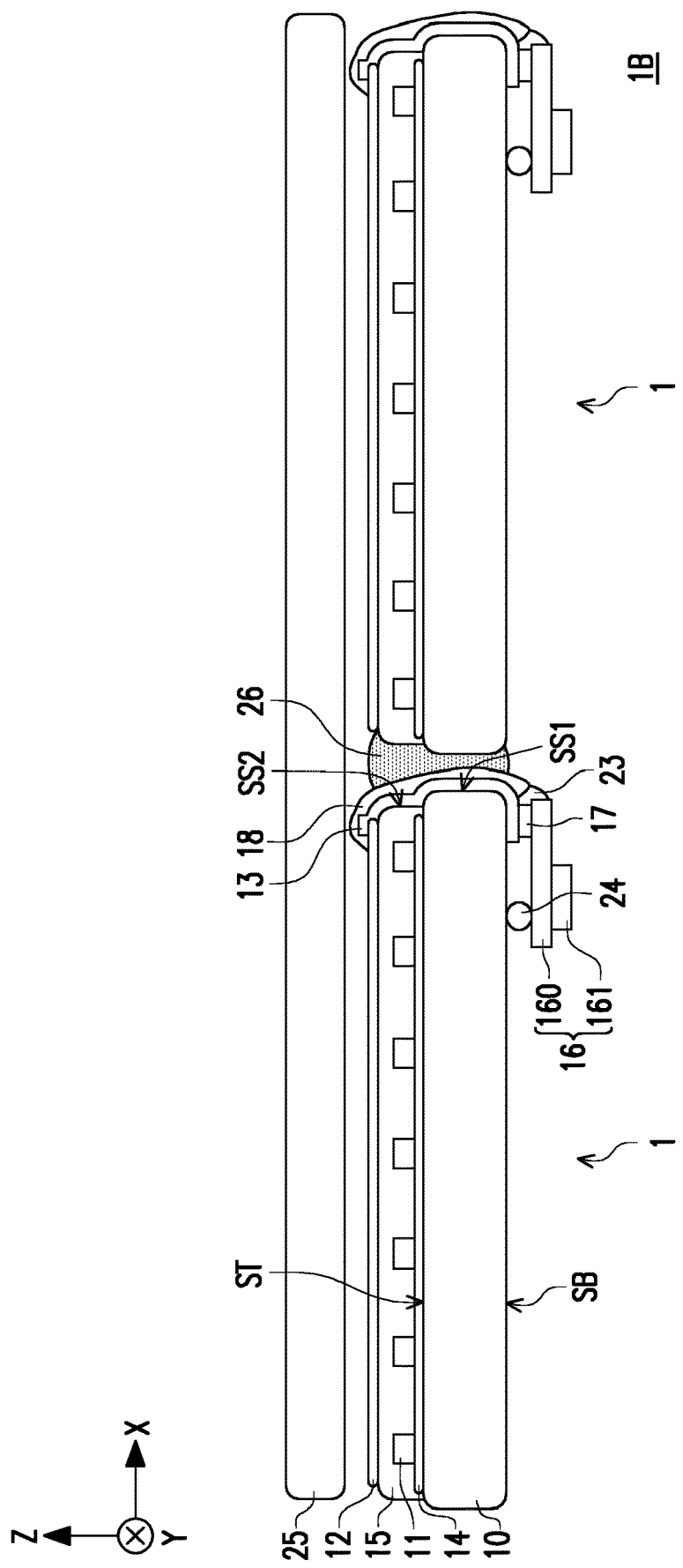
FIG. 5A and FIG. 5B are schematic cross-sectional diagrams corresponding to a section line C-C' and a section line D-D' in FIG. 4 respectively.
Figure 5B:
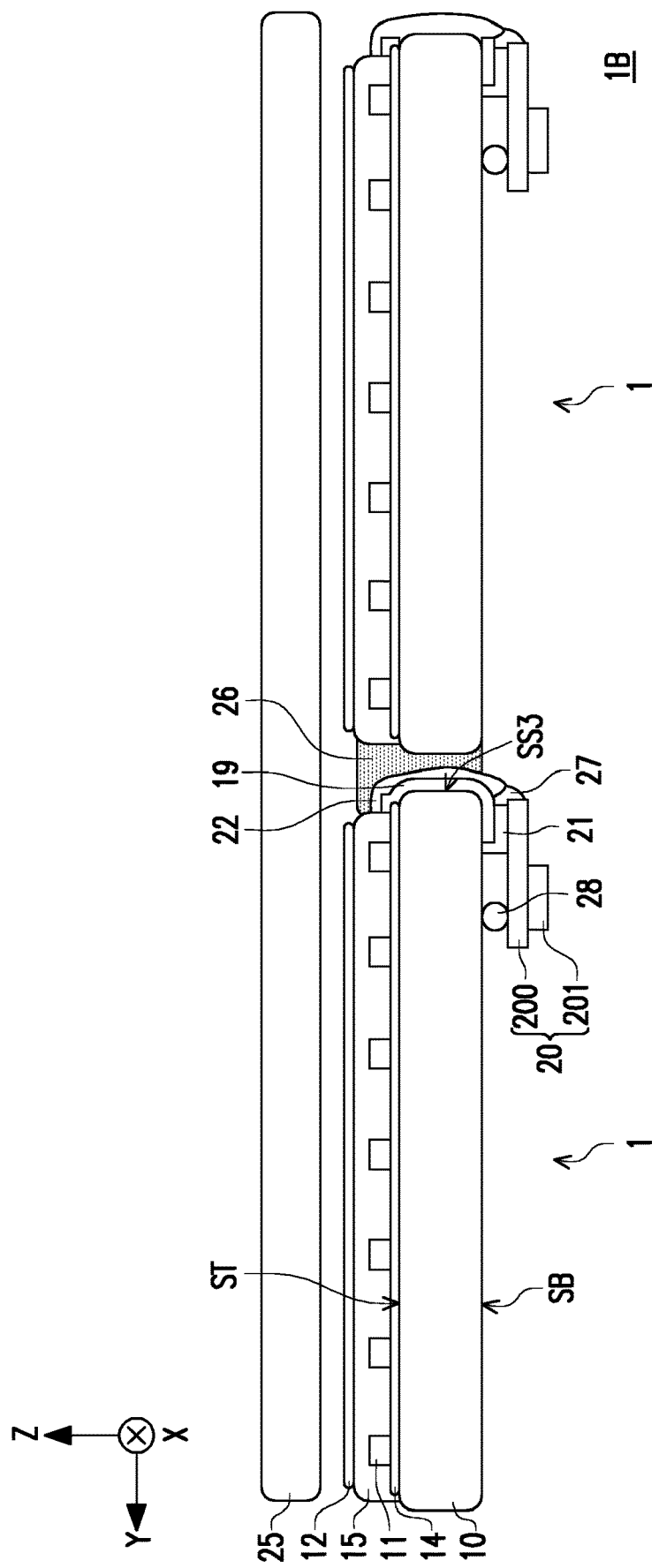

FIG. 4 is a schematic top view of a display panel 1B in some embodiments of the disclosure. FIG. 5A and FIG. 5B are schematic cross-sectional diagrams corresponding to a section line C-C' and a section line D-D' in FIG. 4 respectively. Referring to FIG. 4 to FIG. 5B, the display panel 1B, for example, is formed by tiling a plurality of display panels (such as the display panels 1 in FIG. 1 to FIG. 2B). Tiling the plurality of display panels means that the plurality of display panels are fixed together by a fixing member 26. The fixing member 26 may include an adhesive, a frame, a bottom plate, a tenon, a cover plate or other fixing structures, but is not limited to this. FIG. 4 shows that the fixing member 26 is the adhesive (such as an OCA, a thermosetting adhesive and a photocuring adhesive, but not limited to this), and the display panel 1B is formed by tiling four rectangular display panels 1, but the type of the fixing member 26, the number of the display panels 1 included in the display panel 1B, the shape of the display panels 1 or the arrangement mode of these display panels 1 are not limited to this.

Referring to FIG. 5A and FIG. 5B, in the display panel 1B, based on the consideration of adhesion, protection or electrical property, the area of the conductor 17 covering the conductive member 13 and/or of the conductor 21 covering the conductive member 19 is increased. In addition, the display panel 1B further includes a protective layer 23 and a protective layer 27. The protective layer 23 is disposed among the protective layer 18, the conductive member 13, the conductor 17 and the circuit board 160, and the protective layer 27 is disposed among the protective layer 22, the conductive member 19, the conductor 21 and the circuit board 200. The protective layer 23 and the protective layer 27 may be waterproof insulating layers, such as Tuffy adhesive layers, silicone layers and polyurethane resin (PU adhesives), which can reduce the invasion of water vapor, but are not limited to this. In addition, the display panel 1B may further include a fixing mechanism 24 and a fixing mechanism 28 to fix the driving circuit 16 and the driving circuit 20 respectively. The fixing mechanism 24 and the fixing mechanism 28 may be adhesives (such as OCA, hot-melt adhesives, resin adhesives, thermosetting adhesives and photocuring adhesives, but not limited to this), but are not limited to this. In the present embodiment, the display panel 1B further includes a protective element 25. In the present embodiment, the plurality of display panels 1 share one protective element 25, but are not limited to this. In some embodiments, the display panel 1B may include a plurality of protective elements 25, and the plurality of protective elements 25 are disposed on the plurality of display panels 1. The protective elements 25 may be transparent to allow the light beams emitted by the plurality of light-emitting units 11 to penetrate. The protective elements 25 may include cover plates or protective films. Materials of the cover plates may include glass, plastic, resin or a combination of the above, but are not limited to this. Materials of the protective films may include polyethylene terephthalate (PET) or acrylic, but are not limited to this. The display panel 1B may further include an adhesion layer or other fixing element (not shown) to fix the protective elements 25 on the touch layer 12.

By arranging the driving circuit 16 and the driving circuit 20 on the bottom surface SB of the substrate 10, a tiling gap (a distance between two adjacent display panels 1) can be shortened, and the display quality of the display panel 1B can be improved. In some embodiments, the driving circuit 16 and the driving circuit 20 may simultaneously drive the plurality of display panels 1, for example, the driving circuit 16 and the driving circuit 20 are disposed at the fixing member 26 to drive the left and right display panels 1 (e.g., disposed in the direction X) respectively or drive the upper and lower display panels 1 (e.g., disposed in the direction Y) respectively. In some embodiments, the driving circuit 16 and the driving circuit 20 are disposed at an intersection P as shown in FIG. 4 to drive and control the four display panels 1.

Figure 6A:
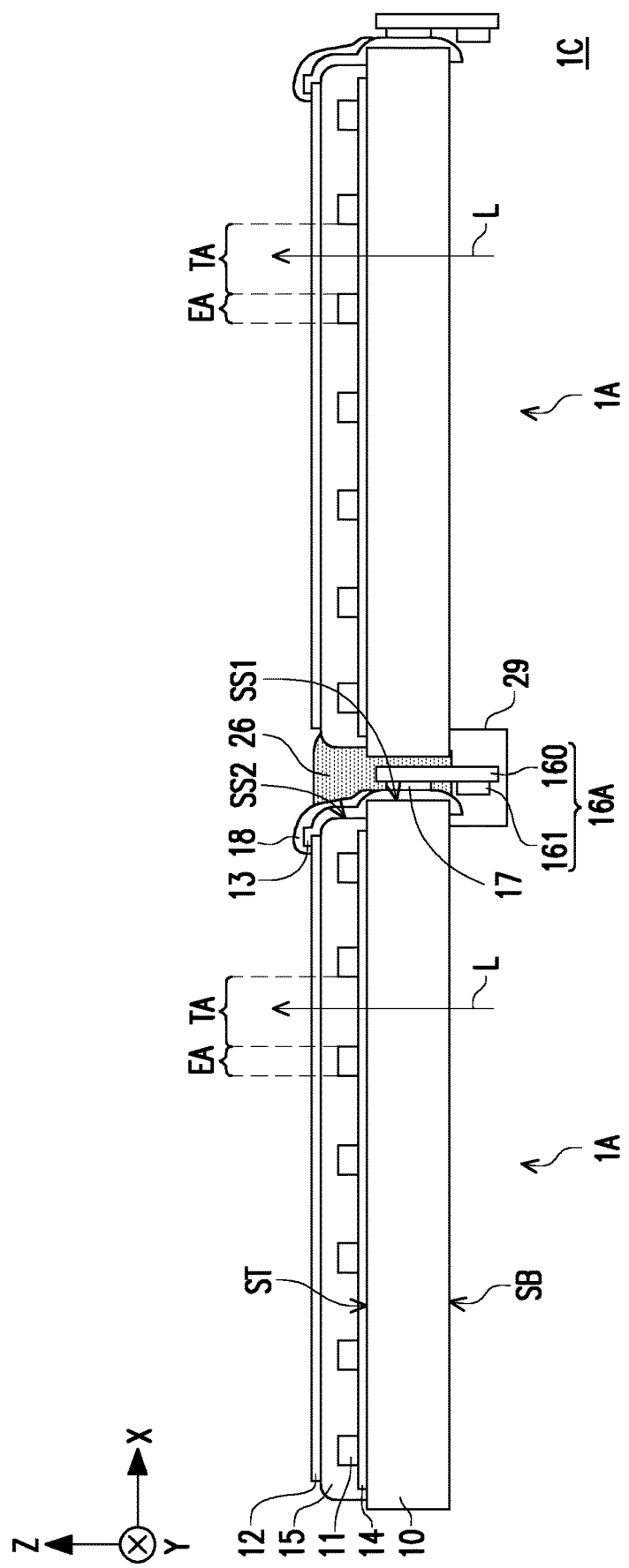
FIG. 6A and FIG. 6B are schematic cross-sectional diagrams of a display panel in some embodiments of the disclosure corresponding to the section line C-C' and the section line D-D' in FIG. 4 respectively.
Figure 6B:
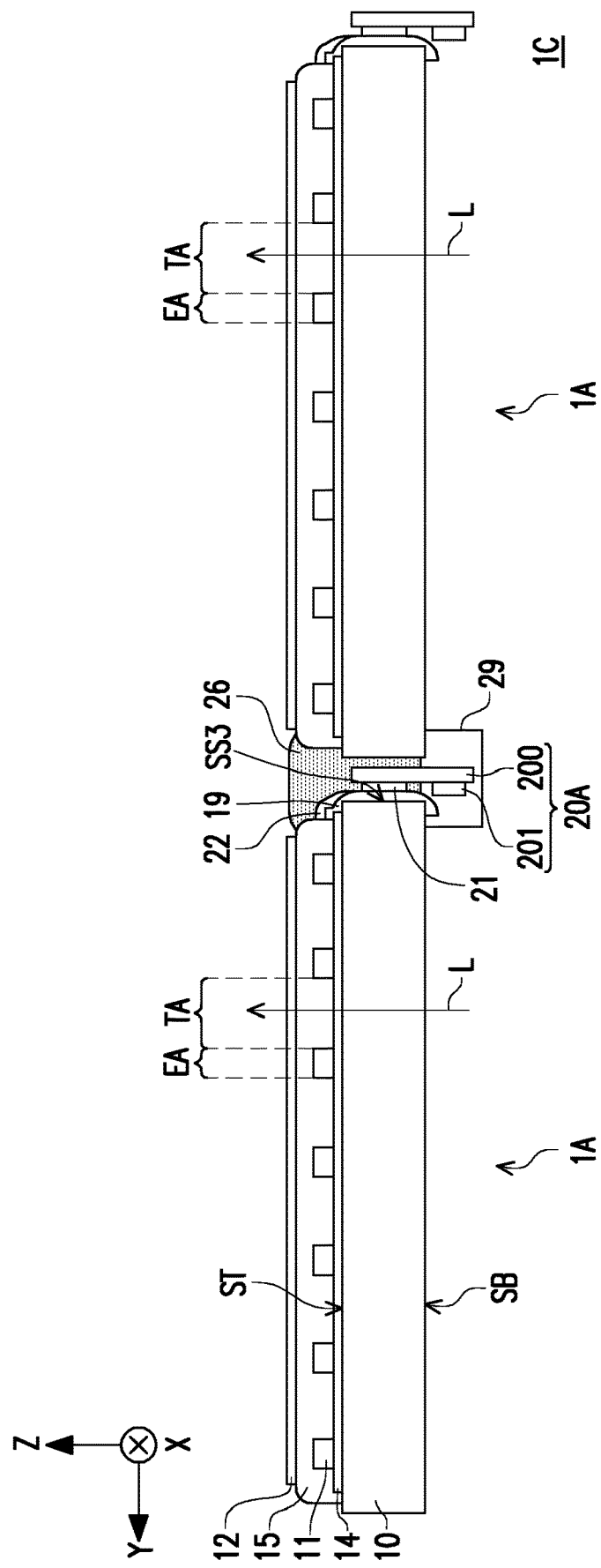

FIG. 6A and FIG. 6B are schematic cross-sectional diagrams of a display panel 1C in some embodiments of the disclosure corresponding to the section line C-C' and the section line D-D' in FIG. 4 respectively. Referring to FIG. 6A and FIG. 6B, the display panel 1C, for example, is formed by tiling a plurality of display panels 1A in FIG. 3. For example, the plurality of display panels 1A may be fixed together by using a fixing member 26. The fixing member 26 may include an adhesive, a frame, a bottom plate, a tenon, a cover plate or other fixing structures, but is not limited to this. FIG. 6A and FIG. 6B show that the fixing member 26 is the adhesive (such as an OCA, a thermosetting adhesive and a photocuring adhesive, but not limited to this). In addition, the display panel 1C may further include one or more protective covers 29. The protective cover 29 may cover a driving circuit (such as a driving circuit 16A and a driving circuit 20A) to provide appropriate protection. Materials of the protective cover 29 may include metal or non-metal. When the protective cover 29 includes the metal, a function of reducing electromagnetic interference (EMI) may further be provided.

By arranging the driving circuit 16A and the driving circuit 20A on the side edge of the display panel 1A, the display panel 1C may be either an opaque display panel or a transparent display panel. For detailed descriptions of the transparent display panel, reference may be made to the foregoing, which will not be repeated here. In some embodiments, the driving circuit 16A and the driving circuit 20A may simultaneously drive the plurality of display panels 1A, for example, the driving circuit 16A and the driving circuit 20A are disposed at the fixing member 26 to drive the left and right display panels 1A (e.g., disposed in the direction X) respectively or drive the upper and lower display panels 1A (e.g., disposed in the direction Y) respectively. In some embodiments, the driving circuit 16A and the driving circuit 20A are disposed at the intersection P as shown in FIG. 4 to drive and control the four display panels 1A.

Figure 7:
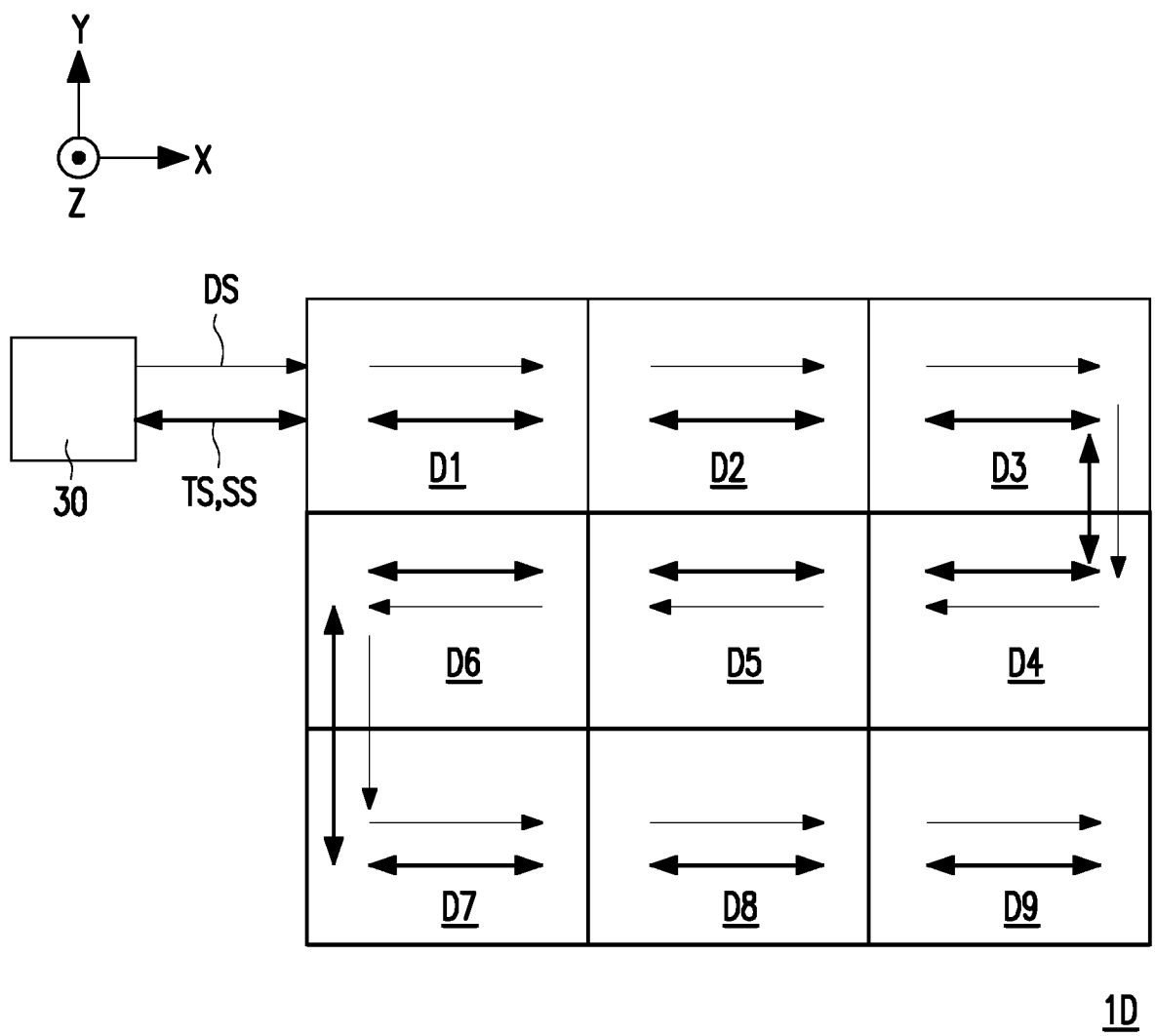
FIG. 7 is a schematic top view of a display panel in some embodiments of the disclosure.

FIG. 7 is a schematic top view of a display panel 1D in some embodiments of the disclosure. Referring to FIG. 7, the display panel 1D, for example, is formed by tiling a plurality of display panels (including display panels D1 to D9). The display panels D1 to D9 may include one or more display panels with touch functions and one or more display panels without the touch functions. In FIG. 7, the display panels D1 to D3, for example, may be the display panels without the touch functions, and the display panels D4 to D9, for example, may be the display panels with the touch functions. However, the number of various display panels, the shape of the display panels and the arrangement mode of the display panels in the display panel 1D may be changed as required, but are not limited to this. For example, the dimensions or shapes of the display panels D1 to D9 may be different, but are not limited to this. In addition, the display panels D1 to D9 may be triangular display panels, square display panels, other polygonal display panels or special-shaped display panels, but are not limited to this.

For cross-sectional drawings of the display panels D4 to D9, reference may be made to the above-mentioned display panels with the touch functions, which will not be repeated here. Structures of the display panels D1 to D3 may be the same as those of the display panels D4 to D9. Or structures of the display panels D1 to D3 may be different from those of the display panels D4 to D9. For example, the display panels D1 to D3 may not include the driving circuit 16 (or the driving circuit 16A) for touch detection. In addition, the display panels D1 to D3 may not include the touch layer 12, or a display panel 2 may include a touch layer with a plurality of signal transmission lines but without a sensing electrode.

The display panel 1D may include one or more controllers 30 to control the display panels D1 to D9. Although FIG. 7 shows one controller 30, the number of the controller 30 or a mode of controlling the display panel 1D is not limited to this. The controller 30 is coupled to the plurality of display panels. The coupling may include a wired or wireless connection for signal transmission. For example, the controller 30 may transmit a drive signal DS for display to the display panel D1, and then the display panel D1 transmits the drive signal DS to the display panel D2. According to this one-to-one signal transmission mode, the drive signal DS may be sequentially transmitted from the display panel D1 to the display panel D9. Similarly, a touch signal TS for touch control output by the controller 30 may be sequentially transmitted from the display panel D1 to the display panel D9. A sensing signal SS may be sequentially transmitted from the display panel D9 to the display panel D1 and then back to the controller 30.

Based on the above, in the embodiments of the disclosure, the touch signal (such as the drive signal or the sensing signal) is transmitted through the conductive member electrically connected to the touch layer, and therefore, the display panel can provide the touch function. In addition, by forming the conductive member for electrically connecting the touch layer and the driving circuit on the first side surface of the substrate, the manufacturing difficulty of the line may be lowered, or the yield of the display panel may be improved.

In an embodiment, by arranging the driving circuit on the bottom surface, narrow frames are achieved. In an embodiment, by arranging the driving circuit on the first side surface, the display panel may be either an opaque display panel or a transparent display panel. In an embodiment, the driving circuit may be electrically connected to the conductive member through the conductor. Based on the consideration of adhesion, protection or electrical property, the area of the conductor covering the conductive member may be increased, or one or more protective layers may be additionally disposed. In an embodiment, the display panel may utilize an external additional mechanism to protect the conductive member so as to omit the protective layer. In an embodiment, the display panel may further include other fixing element to fix the driving circuit. In an embodiment, the display panel may further include a protective element. The protective element may be disposed on the touch layer to protect the touch layer. In addition, the display panel may further include an adhesion layer or other fixing element to fix the protective element to the touch layer. In an embodiment, a plurality of display panels may be tiled into a large display panel. In the tiled display panel, by arranging the driving circuit on the bottom surface of the substrate, the tiling gap may be shortened, and thus the display quality is improved. In an embodiment, the driving circuit may be covered with a metal protective cover, so as to provide protection and/or provide the function of reducing EMI. In an embodiment, the tiled display panel may include one or more display panels with the touch functions and/or one or more display panels without the touch functions, the tiled display panel may include one or more controllers to control the display panels, but is not limited to this.

For thickness measurement, an optical microscopy (OM), a scanning electron microscope (SEM), a film thickness profile meter (α-step), an elliptical thickness meter or other appropriate modes may be used. In details, in some embodiments, local cross-sectional images of a structure are obtained by using the SEM, and the maximum thickness in any one of the cross-sectional images is measured. Or top view images of the structure are obtained by using the OM, and the maximum thickness in any one of the top view images is measured.

The above embodiments are provided merely for describing the technical solutions of the disclosure, but are not intended to limit the disclosure. It should be understood by a person of ordinary skill in the art that although the disclosure has been described in detail with reference to the above embodiments, modifications may be made to the technical solutions described in the above embodiments, or equivalent replacements may be made to some or all technical features in the technical solutions, as long as such modifications or replacements do not cause the essence of corresponding technical solutions to depart from the scope of the technical solutions of the embodiments of the disclosure.

Although the embodiments and advantages of the disclosure have been disclosed above, it should be understood that, a person skilled in the art may make variations, replacements and modifications without departing from the spirit and scope of the disclosure, and features between various embodiments may be arbitrarily mixed and replaced with each other to generate other new embodiments. In addition, the protection scope of the disclosure is not limited to a process, machine, manufacturing, material composition, device, method, and step in a specific embodiment in this specification. A person skilled in the art may understand the existing or to-be-developed process, machine, manufacturing, material composition, device, method, and step from the content of the disclosure, which may be used according to the disclosure as long as the substantially same function may be implemented or the substantially same result may be obtained in the embodiments described herein. Therefore, the protection scope of the disclosure includes the foregoing process, machine, manufacturing, material composition, device, method, and step. In addition, each claim forms an independent embodiment, and the protection scope of the disclosure also includes a combination of claims and embodiments. The protection scope of the disclosure should be subject to the appended claims.

What is claimed is:
1. A display panel, comprising:
 a substrate having a top surface, a bottom surface, and a first side surface disposed therebetween;
 a plurality of light-emitting units disposed on the top surface;

a touch layer, disposed on the top surface;
a conductive member disposed on the first side surface and electrically connected to the touch layer; and
a driving circuit electrically connected to the touch layer through the conductive member, wherein the driving circuit is disposed on the first side surface.

2. The display panel according to claim 1, further comprising:
an insulating layer disposed between the substrate and the touch layer, the insulating layer having a second side surface, wherein the conductive member is disposed on the second side surface.

3. The display panel according to claim 1, wherein the display panel is for tiling with another display panel.

* * * * *